United States Patent [19]

Comerford et al.

[11] 4,156,206

[45] May 22, 1979

[54] GRATING COUPLED WAVEGUIDE LASER APPARATUS

[75] Inventors: Liam D. Comerford, Croton-on-Hudson; Robert A. Laff, Yorktown Heights; Eric G. Lean, Mahopac, all of N.Y.

[73] Assignee: International Business Machines Corporation, Armonk, N.Y.

[21] Appl. No.: 756,043

[22] Filed: Dec. 30, 1976

[51] Int. Cl.² ............................................. H01S 3/05
[52] U.S. Cl. ............................ 331/94.5 C; 350/96.15
[58] Field of Search ................ 331/94.5 H, 94.5 C; 350/96 C, 96 WG; 357/18

[56] References Cited

U.S. PATENT DOCUMENTS

| 3,609,585 | 9/1971 | Hufnagel | 331/94.5 C |
| 3,883,772 | 5/1975 | Wako et al. | 357/17 |

OTHER PUBLICATIONS

Reinhart et al., *Applied Physics Letters*, Jul. 1, 1975, vol. 27, No. 1, pp. 45–48.
Dakss, M. L., *Laser Focus*, Dec. 1975, pp. 31–34.
Ludeke et al., *IBM Technical Disclosure Bulletin*, vol. 15, No. 2, Jul. 1972.

*Primary Examiner*—William L. Sikes
*Attorney, Agent, or Firm*—Robert E. Sandt; Ronald L. Drumheller

[57] ABSTRACT

A semiconductor laser and optical waveguide are coupled together along a common optical axis and bounded at remote ends with reflective surfaces to form an optical resonant cavity. A periodic grating formed in a side surface of the optical waveguide directs some radiant energy out of the cavity in a direction not parallel with the common optical axis.

5 Claims, 4 Drawing Figures

GRATING COUPLED WAVEGUIDE LASER APPARATUS

BACKGROUND OF THE INVENTION

1. Field of Invention

This invention relates to lasers and more particularly to solid state lasers.

2. Prior Art

In solid state lasers the laser cavity supports lasing action in a direction parallel to the laser junction, or to the active layer in a double heterostructure laser. If one of the cavity mirrors is made partially transmissive the radiation will exit substantially normal to the mirrored surface, with the known divergence. If lasers are to be organized in a matrix array and fabricated in gross by successive formation of the necessary electrodes and semiconducting layers with subsequent isolation into individual lasing islands, the normal direction of the exiting radiation somewhat limits the utility of the array. To add mirrors or refractive devices to divert the exiting rays complicates the structure. Prior workers in the field have formed periodic gratings in the surface of a solid state laser. While this does provide coupling out normal to the junctions in the laser, it necessitates a hole in the electrodes or the use of transparent electrodes. Furthermore, the fabrication of the grating in the laser chip may create defect centers to prejudice the life of the laser.

Grating coupled lasers per se are described by D. R. Scifres et al in Applied Physics Letters, Vol. 26, No. 2, Jan. 15, 1975, p48, and by Kazarinov et al in Soviet Physics—Semiconductors, Vol. 6, No. 7, January 1973, p1184. Zory and Comerford in an article entitled "Grating—Coupled Double Heterostructure AlGaAs Diode Lasers," Institute of Electrical and Electronics Engineers Inc. Annals No. 507QE014 also describe the normal to the junction coupling out of laser radiation by means of gratings.

To overcome the drawbacks discussed above the instant invention leaves the solid state laser intact and effects the feedback and coupling out by means of a grating coupled waveguide. This obviates the risk of causing defect centers in the laser and eliminates the necessity for specially constructed electrodes, thus permitting optimum pumping efficiency.

SUMMARY OF THE INVENTION

It is therefore an object of this invention to provide a laser apparatus in which a solid state injection laser is coupled to a waveguide which is provided with a periodic grating which produces a feedback to support the lasing action and also couples the radiation out of the cavity.

A further object is to provide a laser apparatus in accordance with the foregoing object wherein the optical cavity includes the solid state laser, the optical waveguide and two parallel mirrors and the waveguide is formed with one surface thereof having a periodic grating structure.

Yet another object is to provide a laser apparatus in accordance with the first object wherein the optical cavity includes the solid state laser with a mirrored end face, a cylindrical lens abutting the opposite face of the laser and an optical waveguide having a sloping surface formed with a periodic grating.

The foregoing and other objects of the present invention will be apparent from the more particular description of the embodiments of the invention, as illustrated in the accompanying drawings.

DETAILED DESCRIPTION

Figure 1:
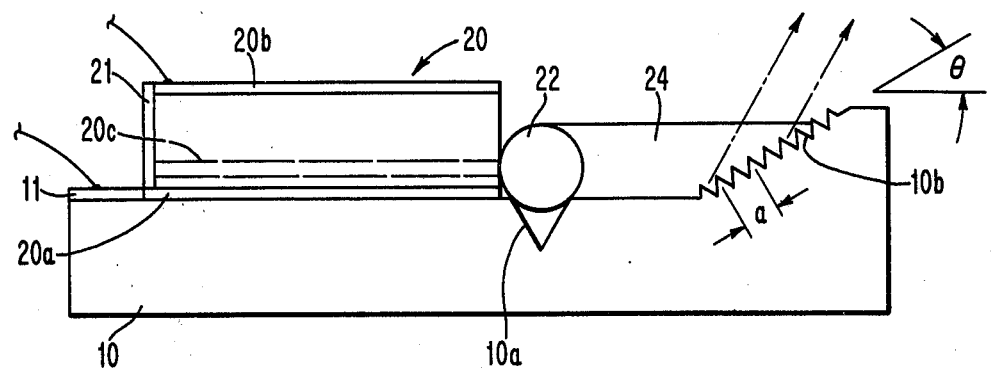
FIG. 1 depicts a cylindrical lens coupling between the laser and the waveguide.

In FIG. 1 the base structure 10 is preferably fabricated of silicon because of the facility with which it may be fabricated by preferential etching and because it makes a good heat sink. The base structure 10 has a deposited contact 11 to which is bonded a mating electrode 20a on the bottom surface of the double heterostructure GaAlAs laser 20. A second electrode 20b provides the electrical connections necessary to produce the requisite population inversions to stimulate emission in the active layer 20c, shown in dotted lines. A mirrored surface 21 on the end face of the laser wafer bounds one end of the lasing cavity and is highly reflective.

At the other face of the laser wafer 20 is a cylindrical lens 22, which is actually a piece of optical fiber without any cladding. The lens 22 is laid in a transverse V-groove 10a preferentially etched into the silicon base member. The axis of the lens 22 is aligned with the active layer 20c so that the normally divergent radiation from the active layer is collimated by the lens and coupled into the waveguide 24. This waveguide 24 is preferably cast from an optical epoxy having an index of refraction higher than that of silicon, and it intimately surrounds the cylindrical lens 22. The waveguide height is equal to the diameter of the lens and extends forward to cover an upwardly sloping ramp 10b having a periodic grating formed in the surface thereof.

The period "a" of the grating 10b is defined by the formula $$a = -m\lambda/(2\cos\theta)$$

wherein m = an integer, $\lambda$ = the wavelength of the radiation in the waveguide material, and $\theta$ = the slope of the ramp with respect to laser axis. For m = 1 the −1 order beam reflects back to the laser and provides the requisite feedback to support the lasing action and creates a coupled cavity configuration, whilst having sufficient leakiness to couple radiation out of the cavity along the lines shown by the dotted arrows.

Figure 2:
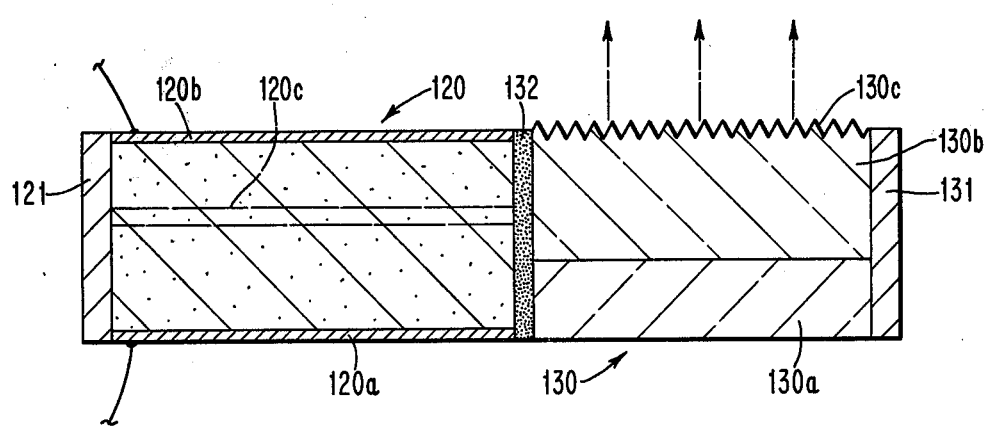
FIG. 2 is a schematic showing of a directly butt coupled laser and waveguide.

An alternative waveguide coupled laser apparatus is illustrated in FIG. 2. Here the double heterostructure laser 120 with its energizing electrodes 120a and 120b active lasing layer 120c and cavity mirror 121 are physically attached to and optically coupled to the waveguide structure 130 by means of the optical epoxy 132. The optical waveguide is provided with the fully reflecting mirror 131 parallel to the mirror 121 to form a Fabry-Perot cavity. The waveguide 130 further includes the substrate 130a and superstrate 130b of a higher index of refraction. A periodic grating 130c is formed in the upper surface of the waveguide to provide a leaky waveguide from which some of the laser radiation may exit in the direction of the arrows.

The two sections in the cavity, the pumped gallium arsenide structure, and the corrugated optical waveguide are coupled through the interface with an amplitude of reflectivity, $R=(3.6-n)\div(3.6+n)$, where n is the index of refraction in the waveguide region. For example, if $n=2$, R will equal 0.28. The two sections are strongly coupled into a single cavity mode. Thus, the grating in the second section can affect the lasing of the structure, and also provide an output coupler for the laser.

Figure 3:
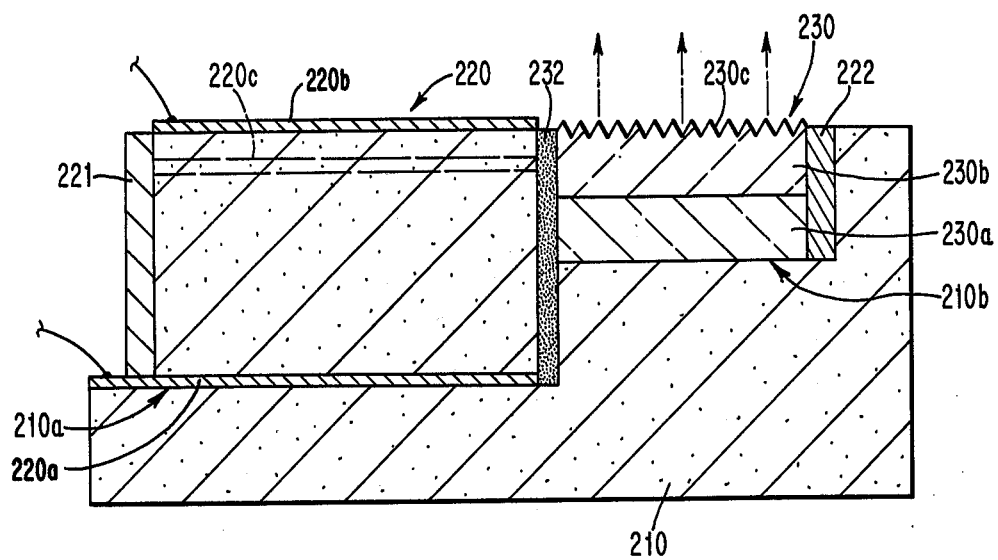
FIG. 3 shows the apparatus of FIG. 2 mounted on a common base.

To facilitate the fabrication and alignment of a device such as the one illustrated in FIG. 2 the structure shown in FIG. 3 may be employed to advantage. A stepped base structure 210 has two etched steps 210a and 210b, such that the active layer 220c of the laser 220 will align with the corrugated waveguide 230. This waveguide as in FIG. 2 is provided with the periodic grating 230c formed in the waveguide material 230b. A silicon dioxide buffer layer 230a is interposed between the waveguide and the silicon base structure 210. Electrodes 220a and 220b provide the means for pumping the laser and the mirrors 221 and 222 define the resonating cavity. Optical epoxy fills the void between the waveguide and the laser.

Figure 4:
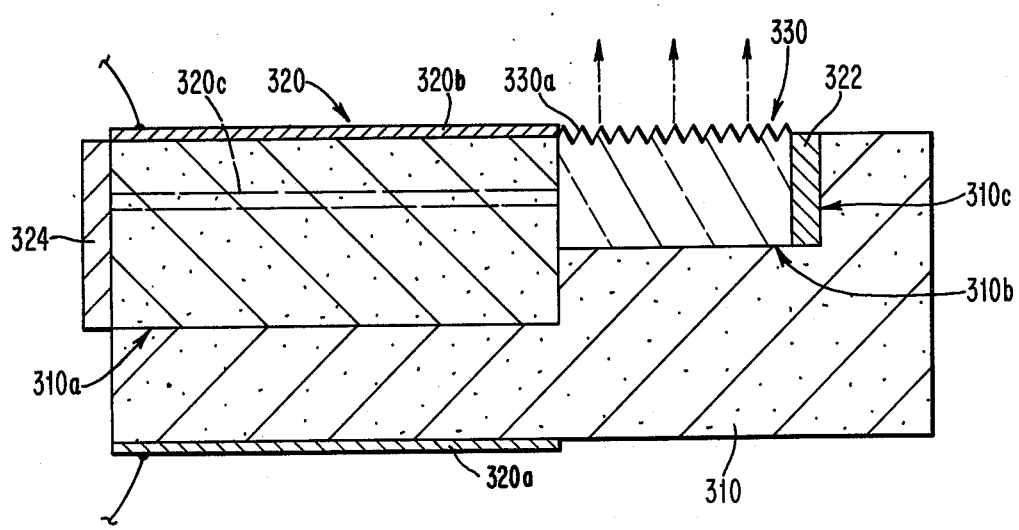
FIG. 4 shows another structure for mounting the apparatus of FIG. 2 on a common base.

To obviate some of the alignment difficulties that arise with the structure of FIG. 3, that shown in FIG. 4 can be used to advantage. Here the material of the base structure 310 is the substrate material of a double heterostructure laser 320. The base is etched to form two steps 310a and 310b. On the former of these two steps are deposited the successive layers to form the buffer layer, the active layer, and the second buffer layer of the DH laser. Electrodes 320a and 320b potentialize the laser to produce the population inversion. The second step 310b is terminated short of the end of the base member 310 by the vertical surface 310c upon which a mirrored surface 322 is deposited. A parallel mirror 324 completes the resonating cavity. The volume between the mirror 322 and the laser 320 is filled with an optical material 330 the upper surface of which is formed with the periodic grating 330a. The height of the steps and the geometry of the laser is so chosen that the active layer 320c of the laser is essentially coplanar with the median plane of the waveguide 330.

In the foregoing embodiments, the laser is not subjected to any past-fabrication etching to form grating structures which can lead to development of defect centers. All of the grating structures are formed in the waveguide external of the laser and act to provide feedback and coupling out of the radiation in a direction non-parallel to the laser junctions. When lasers of this structural arrangement are incorporated in a matrix array, the radiation from each of the lasers will exit from the array without further reflective or refractive elements.

While the invention has been particularly shown and described with reference to several embodiments, it will be understood by those skilled in the art that various changes in form and detail may be made therein without departing from the spirit of the invention.

What is claimed is:

1. An optical coupling arrangement, comprising:
   semiconductor laser means having an active layer and two opposite end faces perpendicular to said active layer, radiant energy tending to exit from said active layer through said laser end faces;
   a first reflective surface adjacent to and parallel with one of said laser end faces to reflect back into said active layer radiant energy tending to exit through said one laser end face;
   an optical waveguide coupled at one end to the other of said laser end faces for receiving and guiding radiant energy exiting through said other laser end face from said active layer to an end of said waveguide remote from said laser means; and
   a second reflective surface adjacent to said remote end of said waveguide for returning radiant energy from said active layer back through said waveguide to said active layer, thereby forming a resonant optical cavity;
   a periodic grating on a side surface of said waveguide for directing some radiant energy out of said resonant optical cavity in a direction not parallel with said active layer.

2. An optical coupling arrangement as defined in claim 1 wherein said periodic grating is substantially parallel with said active layer.

3. An optical coupling arrangement as defined in claim 1 wherein said periodic grating comprises corrugations in a side surface of said waveguide.

4. An optical coupling arrangment as defined in claim 1 wherein said periodic grating is bounded by a medium having a lower index of refraction than the material of said waveguide.

5. An optical coupling arrangement as defined in claim 1 wherein said periodic grating is bounded by air.

* * * * *